(12) United States Patent
Ozgur

(10) Patent No.: US 7,675,443 B1
(45) Date of Patent: Mar. 9, 2010

(54) SATURATION DETECTOR FOR AN ADC

(75) Inventor: Soner Ozgur, Santa Clara, CA (US)

(73) Assignee: Atheros Communications, Inc., Santa Clara, CA (US)

(*) Notice: Subject to any disclaimer, the term of this patent is extended or adjusted under 35 U.S.C. 154(b) by 0 days.

(21) Appl. No.: 12/145,978

(22) Filed: Jun. 25, 2008

(51) Int. Cl.
*H03M 1/00* (2006.01)

(52) U.S. Cl. .................. 341/139; 341/143; 341/155; 341/138

(58) Field of Classification Search .......... 341/138, 341/155, 143, 139; 329/304, 306; 375/222, 375/324, 345, 347, 349; 455/140, 234.2, 455/241.1
See application file for complete search history.

(56) References Cited

U.S. PATENT DOCUMENTS

| 5,654,711 A * | 8/1997 | Fujimori ................. 341/143 |
| 6,545,532 B1 * | 4/2003 | Maalej et al. ............ 329/304 |
| 7,463,704 B1 * | 12/2008 | Tehrani et al. .......... 375/345 |

* cited by examiner

*Primary Examiner*—Jean B Jeanglaude
(74) *Attorney, Agent, or Firm*—Bever, Hoffman & Harms, LLP; Jeanette S. Harms

(57) ABSTRACT

A method for detecting saturation in a cascaded ΔΣ ADC can include receiving an output of the cascaded ΔΣ ADC, determining a magnitude of the output, and squaring the magnitude. The squared magnitude can be added to a feedback signal, wherein the sum represents a saturation signal. The saturation signal can be filtered and then amplified, wherein the amplified, filtered saturation signal is the feedback signal. The saturation signal can then be compared to a threshold to determine whether the cascaded ΔΣ ADC is in saturation.

5 Claims, 3 Drawing Sheets

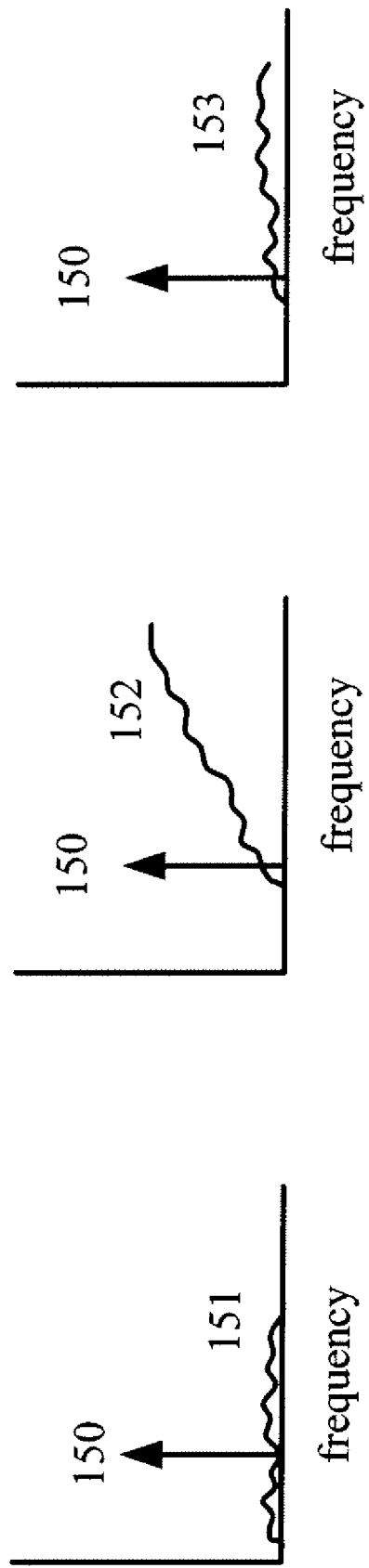

SATURATION DETECTOR FOR AN ADC

BACKGROUND OF THE INVENTION

1. Field of the Invention

The present invention relates to analog to digital converters (ADCs) and in particular to a saturation detector for a cascaded ΔΣ ADC.

2. Related Art

A typical receiver includes a front-end receive chain with multiple amplifiers connected in series between an antenna and an analog to digital converter (ADC). Additional components can be included in receiver chain to indicate whether the amplifiers are going to saturate. Because these amplifiers are analog components, detecting saturation is relatively easy.

Detecting saturation is desirable because signal processing should be linear and saturation causes non-linearity, thereby making signal processing difficult.

Note that an ADC can have an output with multiple quantization stages, e.g. providing an 8-bit output value. This 8-bit output value can also be easily analyzed to determine whether it is within predetermined boundaries. If the value is too low or too high, then the gain of the amplifiers can be adjusted.

In contrast, the output of a ΔΣ ADC is a one-bit value, i.e. a zero or a one. Detecting saturation of a one-bit, digital value can be challenging. Specifically, the ΔΣ ADC can achieve high signal to noise ratio (SNR) by processing samples very often, but at a cost of quantization level.

For example, FIG. 1A illustrates an exemplary signal 150 and associated noise 151 as input to a ΔΣ ADC. In contrast, FIG. 1B illustrates an output of the ΔΣ ADC, i.e. the signal and noise, when components of the ΔΣ ADC are not saturated. Note that the noise can exhibit a strong ramp function 152 based on a discrete time frequency measurement.

The ΔΣ ADC can include a plurality of stages, each stage including an integrator and a quantizer (described in further detail below). When any of the integrators start to saturate, the output of the ΔΣ ADC can be that shown in FIG. 1C. Note that the noise typically exhibits a minimal ramp function 153. In one embodiment, to determine the saturation of the integrators, a saturation detector for the ΔΣ ADC can include a high pass filter that filters out signal 150 and then determines whether the noise exhibits a frequency response closer to that of FIG. 1B or 1C. Unfortunately, this determination involves complex and computation-intensive algorithms that are difficult to run on the output of the ADC.

SUMMARY OF THE INVENTION

A saturation detector for a cascaded ΔΣ ADC can include a magnitude square unit, an adder, a filter, an amplifier, and a comparator. The magnitude square unit can receive an output of the cascaded ΔΣ ADC, determine a magnitude of the output, and then square that magnitude. The adder can receive the output of the magnitude square unit and provide a sum output as a saturation signal. The filter can filter the saturation signal and output a filtered saturation signal. The amplifier can amplify the filtered saturation signal and provide an amplified, filtered saturation signal to the adder as a feedback signal. The comparator can compare the saturation signal to a threshold and determine whether the cascaded ΔΣ ADC is in saturation.

In one embodiment, the threshold is programmable. In one embodiment, the filter can include a leaky bucket filter. In another embodiment, the filter can include a first order, low pass filter.

In accordance with one method for detecting saturation in a cascaded ΔΣ ADC, the method can include receiving an output of the cascaded ΔΣ ADC, determining a magnitude of the output, and squaring the magnitude. The squared magnitude can be added to a feedback signal, wherein the sum represents a saturation signal. The saturation signal can be filtered and then amplified, wherein the amplified, filtered saturation signal is the feedback signal. The saturation signal can then be compared to a threshold to determine whether the cascaded ΔΣ ADC is in saturation.

BRIEF DESCRIPTION OF THE FIGURES

FIG. 1A illustrates a signal and noise as received by the ΔΣ ADC.

FIG. 1B illustrates the signal and quantization noise when the integrators of the ΔΣ ADC are not saturated.

FIG. 1C illustrates the signal and quantization noise when the integrators of the ΔΣ ADC are saturated.

DETAILED DESCRIPTION OF THE FIGURES

In accordance with one ΔΣ ADC, $2^{nd}$ order and $1^{st}$ order ADCs can be cascaded. This cascading can advantageously achieve a desirable noise shaping of a $3^{rd}$ order system. Moreover, the sensitivity to component variations in terms of stability can be compared to the sensitivity of a $2^{nd}$ order system.

Figure 1D:
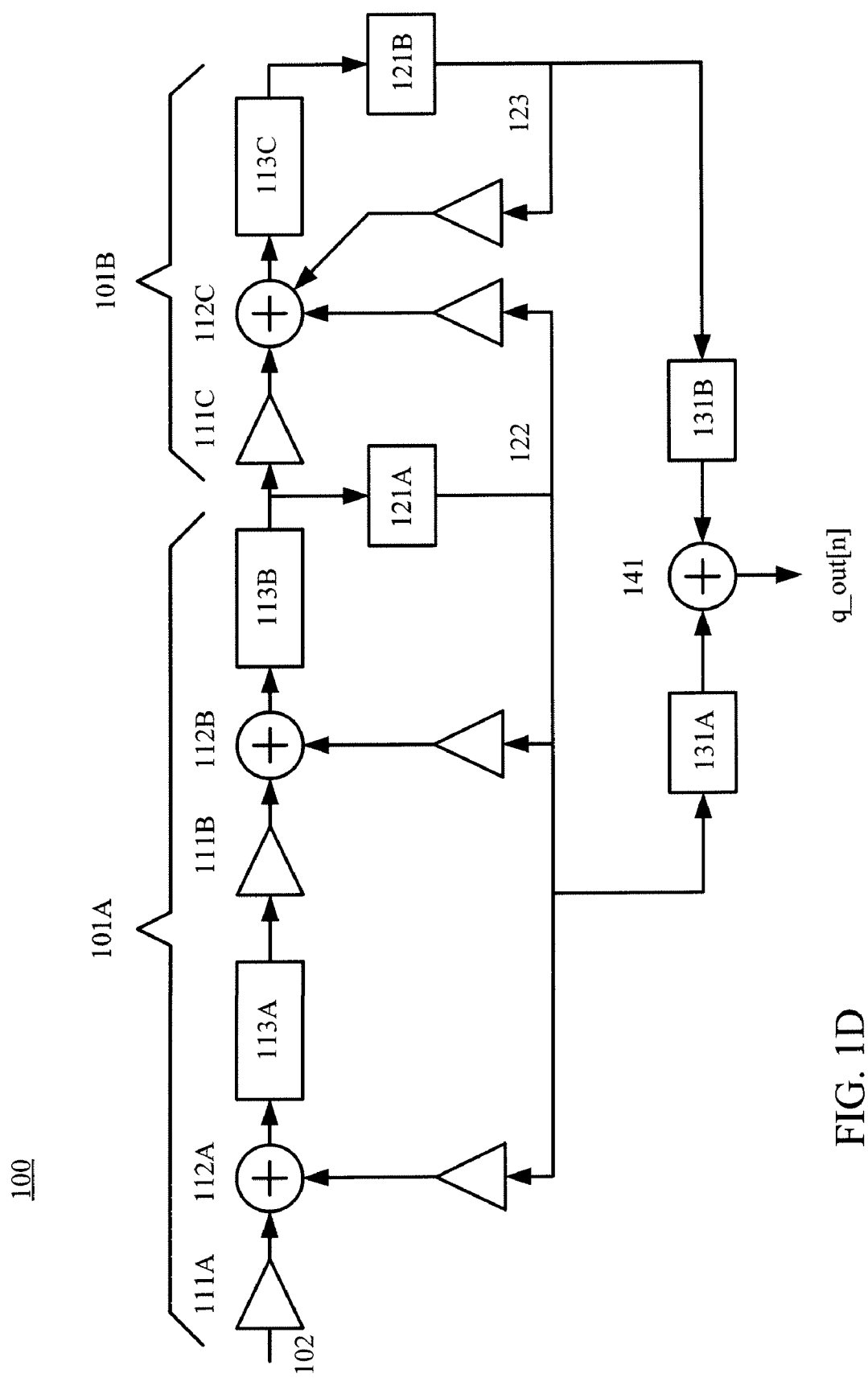
FIG. 1D illustrates an exemplary cascaded ΔΣ ADC model that includes a $2^{nd}$ order stage and a $1^{st}$ order stage.

FIG. 1D illustrates an exemplary ΔΣ ADC 100 that includes two cascaded stages 101A and 101B. In this embodiment, stage 101A is a $2^{nd}$ order stage, i.e. including two integrators, and stage 101B is a $1^{st}$ order stage, i.e. including a single integrator. Specifically, stage 101A includes integrators 113A and 113B, whereas stage 101B includes an integrator 113C. An ADC input to ADC 100 is buffered by buffer 111A and then added to at least one feedback signal (described below) using adder 112A. This summed signal is then integrated by integrator 113A. Buffers 111B/111C, adders 112B/112C, and integrators 113B/113C function in a similar manner. Integrators are known to those skilled in the art of ΔΣ ADCs and therefore are not explained in further detail herein.

A quantizer 121A quantizes an output 122 of stage 101A, whereas a quantizer 121B quantizes an output 123 of stage 101B. In general, quantizers process samples in order to represent such samples as digital output. Quantizers are known to those skilled in the art of ΔΣ ADCs and therefore are not explained in further detail herein. Output 122 is amplified and then provided to adders 112A, 112B, and 112C as a feedback signal. Output 123 is amplified and then provided to adder 112C as a feedback signal.

Output 122 of quantizer 121A can be described with equation 1.

$$Y_1(z) = F_1(z)X(z) + G_1(z)Q_1(z) \qquad \text{(equation 1)}$$

where X(z) is input signal 102, $Q_1(z)$ is the quantization noise introduced by the first stage quantizer 121A, $F_1(z)$ is the signal transfer function (STF) of stage 101A, and $G_1(z)$ is the noise transfer function (NTF) of stage 101A.

The feedforward gains of buffers 111A and 111B and the feedback gains (from the amplifiers) in stage 101A are chosen such that the STF $F_1(z)$ is flat in the frequency band of interest and the NTF $G_1(z)$ gives $2^{nd}$ order spectral shaping to the noise $Q_1(z)$ $((1-z^{-1})^2)$ The output of the second stage quantizer 123 can be expressed with equation 2.

$$Y_2(z)=F_2(z)X(z)+G_2(z)Q_1(z)+H_2(z)Q_2(z) \quad \text{(equation 2)}$$

where X(z) is input signal 102, $Q_1(z)$ is the quantization noise introduced by quantizer 121A, $Q_2(Z)$ is the quantization noise introduced by quantizer 121B, $F_2(z)$ is the STF of stage 101B, $G_{-2}(Z)$ is the transfer function that applies on the noise signal $Q_1(z)$, and $H_2(z)$ is the noise transfer function (NTF) of stage 101B.

The feedforward gain of buffer 111C and the feedback gains (from the amplifier) in stage 101B are chosen such that the STF $F_2(z)$ is also flat in the frequency band of interest, the NTF $G_2(z)$ is nearly flat, the NTF $H_2(z)$ gives 1st order spectral shaping to the noise $Q_2(z)$ ($(1-z^{-1})$)

The 1-bit digital signals $Y_1(z)$ and $Y_2(z)$ can be filtered and then added as shown in equation 3.

$$Q\_out(z)=B_1(z)Y_1(z)+B_2(z)Y_2(z) \quad \text{(equation 3)}$$

The filters $B_1(z)$ and $B_2(z)$ are chosen such that $$B_1(z)G_1(z)+B_2(z)G_2(z)\approx 0 \quad \text{(equation 4)}$$

and the overall result can be approximated with equation 5

$$Q\_out(z)=B_1(z)F_1(z)X(z)+B_2(z)F_2(z)X(z)+B_2(z)H_2(z)Q_2(z)$$

To achieve the desired $3^{rd}$ order spectral shaping effect, the filter $B_1(z)$ is chosen to be nearly flat in the band of interest, and the filter $B_2(z)$ is chosen to have a second order high-pass shape. With such a choice of filters, the middle term vanishes in equation 5 because the low-pass input signal gets filtered out. The remaining quantization noise has nearly $3^{rd}$ order shaping due to $B_2(z)H_2(z)$ and any additional noise because of imperfect cancellation in equation 4.

$$Q\_out(z)\approx B_1(z)F_1(z)X(z)+B_2(z)H_2(z)Q_2(z) \quad \text{(equation 6)}$$

Notably, quantizer outputs 122 and 123, which are one-bit signals, have high-pass spectral shapes. These shapes can be filtered by filters 131A and 131B. In one embodiment, filters 131A and 131B can be implemented using simple FIR filters. The outputs of filters 131A and 131B can be summed by adder 141, thereby destructively combining the quantization effects of first stage 101A. Notably, the output q_out[n] of adder 141, which is a 4-bit signal, advantageously has additive quantization noise with third order spectral shaping. Moreover, the sensitivity (i.e. the precision) used for download components can be advantageously reduced. That is, in this configuration of ΔΣ ADC 100, relatively coarse downstream components can be used for signal processing without loss of sensitivity.

When the ADC input 102 has nominal size, ΔΣ ADC 100 is not saturated. In this case, quantized output 122 and 123 are dominated by a high-level, high-pass noise (see, e.g. FIG. 1B). The filter 131B is advantageously implemented as inherently high-pass filter. Thus, filters 131A and 131B can emphasize the quantization noise, but do not attenuate the input signal. Note that by choosing different coefficients for filters 131A and 131B, and different feed-forward and feedback gains for the loop stages, the tradeoff between signal to noise ratio (SNR) and dynamic range can be adjusted. Additionally, the same values can adjust the tradeoff between the sensitivity of the circuit to analog design imperfections. In this configuration of ΔΣ ADC 100, the variances (power) of signals 122 and 123 are 0.5 because they are digital 1-bit signals (0-1 signals). When the ADC is not saturated, the main contributor to this power is the spectrally-shaped quantization noise.

In contrast, when ADC input 102 is very large, ADC integrators 113A/113B/113C start to saturate and the spectral shaping of the quantization noise substantially disappears (see, e.g. FIG. 1C). In such conditions, the ADC input 102 is close to the maximum allowed voltage swing. Hence, quantizers 121A and 121B cannot contribute much to bringing the voltage to the maximum reference voltage. The quantization noise is still present, but it is orders of magnitude lower compared to the input signal. The main contributor to the signal power is the excessively large input signal. The ADC input signal is a low-frequency signal because all other frequency signals have already been attenuated by the anti-alisaing filters before the ADC. Therefore, such a large signal, if present, will be attenuated by the high-pass digital filter 131B ($B_2(z)$). The variance of the signal at the output of 131B will be significantly lower compared to the case when the ADC has not saturated. This will cause the power of the ADC output q_out[n] to be also low.

As noted above, the feedback loops in ΔΣ ADC 100 include quantizers 121A and 121B. Therefore, the effects of saturation are observed with a very sharp transition. Specifically, ΔΣ ADC 100 saturates immediately after the signal level is raised above a specific level. As a result, the power of the ADC output q_out[n] (i.e. its signal variance) also drops sharply to a drastically low value because of the lack of spectral shaping.

Figure 2:
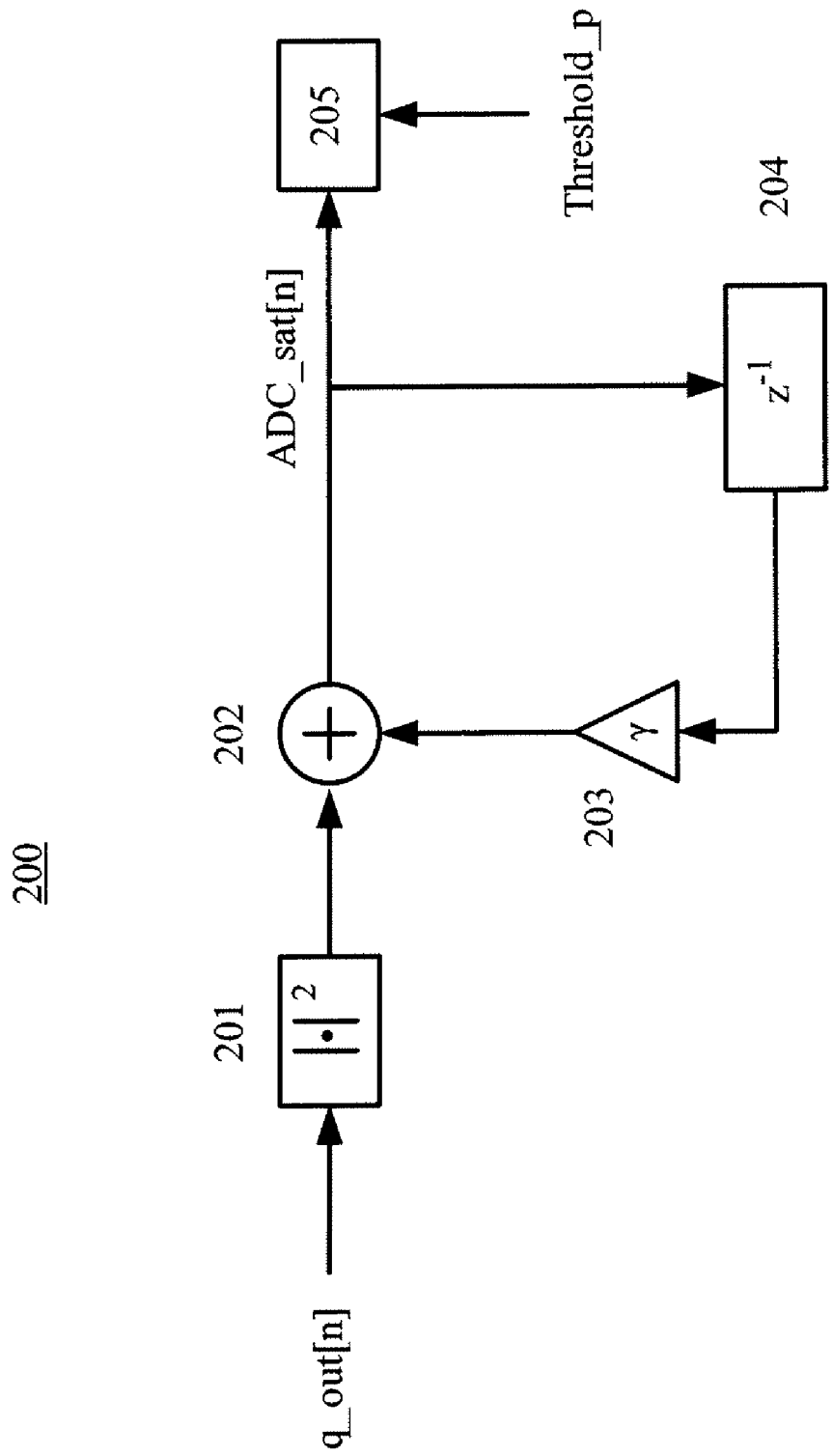
FIG. 2 illustrates an exemplary saturation detector for a ΔΣ ADC.

In accordance with one aspect of an improved, cascaded ΔΣ ADC, a variance estimator can be advantageously used to detect saturation. FIG. 2 illustrates an exemplary variance estimator 200 that can receive the ADC output q_out[n] and output a distinguishable saturation signal ADC_sat[n]. In this embodiment, variance estimator 200 can include magnitude square unit 201, which determines the magnitude of ADC output q_out[n] and then squares that magnitude. An adder 202 adds the output of magnitude square block 201 to a feedback signal (described below). The sum generated by adder 202 is the saturation signal ADC_sat[n]. The saturation signal ADC_sat[n] is provided to an infinite impulse response (IIR) leaky bucket (e.g. a first order, low pass) filter 204, whose output is then provided to an amplifier 203 (which can provide a multiplier greater than 1, e.g. 2). The output of amplifier 203 is then provided to adder 202 as the above-described feedback signal. In this configuration, variance estimator 200 provides a running sum of magnitude squares windowed by an exponential window.

In one embodiment, a comparator 205 can compare the saturation signal ADC_sat[n] to a fixed, programmable threshold Threshold_p. Notably, this comparison is counter-intuitive. That is, if the signal ADC_sat[n] is below the threshold, then the ΔΣ ADC is in saturation.

Although illustrative embodiments of the invention have been described in detail herein with reference to the accompanying figures, it is to be understood that the invention is not limited to those precise embodiment. They are not intended to be exhaustive or to limit the invention to the precise forms disclosed. As such, many modifications and variations will be apparent. Accordingly, it is intended that the scope of the invention be defined by the following claims and their equivalents.

The invention claimed is:

1. A saturation detector for a cascaded ΔΣ ADC, the saturation detector comprising:
   a magnitude square unit for receiving an output of the cascaded ΔΣ ADC, determining a magnitude of the output, and squaring the magnitude;
   an adder for receiving an output of the magnitude square unit and providing a sum output as a saturation signal;

a filter for filtering the saturation signal and outputting a filtered saturation signal;

an amplifier for amplifying the filtered saturation signal and providing an amplified, filtered saturation signal to the adder; and a comparator for comparing the saturation signal to a threshold and determining whether the cascaded ΔΣ ADC is in saturation.

2. The saturation detector of claim 1, wherein the threshold is programmable.

3. The saturation detector of claim 1, wherein the filter includes a leaky bucket filter.

4. The saturation detector of claim 1, wherein the filter includes a first order, low pass filter.

5. A method for detecting saturation in a cascaded ΔΣ ADC, the method comprising:

receiving an output of the cascaded ΔΣ ADC;

determining a magnitude of the output;

squaring the magnitude;

adding the squared magnitude to a feedback signal and outputting a sum that represents a saturation signal;

filtering the saturation signal and outputting a filtered saturation signal;

amplifying the filtered saturation signal and providing the amplified, filtered saturation signal as the feedback signal; and comparing the saturation signal to a threshold to determine whether the cascaded ΔΣ ADC is in saturation.

* * * * *